United States Patent
Senzaki et al.

(10) Patent No.: US 6,319,567 B1
(45) Date of Patent: Nov. 20, 2001

(54) SYNTHESIS OF TANTALUM NITRIDE

(75) Inventors: Yoshihide Senzaki, Carlsbad; Arthur Kenneth Hochberg, Solana Beach; John Anthony Thomas Norman, Encinitas, all of CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/281,616

(22) Filed: Mar. 30, 1999

Related U.S. Application Data

(63) Continuation-in-part of application No. 09/256,933, filed on Feb. 24, 1999.

(51) Int. Cl.$^7$ ................................................. C23C 16/34
(52) U.S. Cl. ................................. 427/565; 427/255.394; 427/907
(58) Field of Search .......................... 477/565, 255.394, 477/907

(56) References Cited

U.S. PATENT DOCUMENTS 5,139,825 8/1992 Gordon et al. .................... 427/255.2
6,015,917 * 1/2000 Bhandari et al. .

FOREIGN PATENT DOCUMENTS

869544 * 7/1998 (EP) .

0869544  10/1998 (EP) .............................. H01L/21/285

OTHER PUBLICATIONS

Chiu et al., J. Chin. Chem. Soc. vol. 45, No. 3, 1998, (no month).*
Fix, et. al., Chemical Vapor Deposition of Vanadium, Niobium and Tantalum Nitride Thin Films, Chem. Mater., vol. 5, (1993) pp. 614–619 (No Month).
Tsai, et. al., Metalorganic Chemical Vapor Deposition Of Tantalum Nitride By Tertbutylimidotris(Diethylamido)Tantalum For Advanced Metallization, Appl. Phys. Lett. 67, (8) Aug. 1995, pp. 1128–1130.
Chiu, et. al., Syntheses and Characterization of Organoimido Complexes of Tantalum; Potential Single–Source Precursors to Tantalum Nitride, Polyhedran, vol. 17, Nos. 13–14, (1998) pp. 2187–2190 (No Month).

(List continued on next page.)

*Primary Examiner*—Timothy Meeks
(74) *Attorney, Agent, or Firm*—Geoffrey L. Chase

(57) ABSTRACT

A method for producing a tantalum nitride layer on a substrate, comprising; directly injecting a liquid mixture of $(R^1R^2N)_3Ta(=NR^3)$ and $(R^4R^5N)_3Ta[\eta^2—R^6N=C\ (R^7)(R^8)]$ into a dispersing zone followed by delivering the dispersed mixture into a reactor containing the substrate at elevated temperature and reacting the mixture with a source of nitrogen selected from the group consisting of ammonia, alkyl amines, $N_2H_2$, alkyl hydrazine, $N_2$ and mixtures thereof, to produce the tantalum nitride layer on the substrate, where $R^1$, $R^2$, $R^3$, $R^4$, $R^5$, $R^6$, $R^7$ and $R^8$ are individually $C_{1-6}$ alkyl, aryl or hydrogen.

8 Claims, 2 Drawing Sheets

OTHER PUBLICATIONS

Chiu, et. al., Deposition of Tantalum Nitride Thin Films From Ethylimidotantalum Complex, J. Mat. Sci. Lett, vol. 11, (1992) pp. 96–98 (No Month).

Jun et. al., Low Temperature Deposition of TaCN Films Using Pentakis(diethylamido)tantalum, Jpn. J. Appl. Phys., vol. 37, (1998), pp. L30–L32 (No Month).

Chiu, et. al., Deposition of Molybdenum Carbonitride Thin Film From Mo(NBu$^t$)$_2$(NHBu$^t$)$_2$, J. Mater. Res., vol. 9, No. 7, (Jul. 1994), pp. 1622–1624.

Chiu, et. al., Tungsten Nitride Thin Films Prepared by MOCVD, J. Mater. Res., vol. 8, No. 6, (Jun. 1993), pp. 1353–1360.

Chiu, et. al., Syntheses and Characterization of Organoimido Complexes of Niobium(V); Potential CVD Precursors, J. Chin. Chem. Soc., vol. 45, No. 3, (1998), pp. 355–360 (No Month).

Bradley, et al. Can. J. Chem. 1962, 40, p. 1355–1360 (No Month).

Takahashi, Y. et al. Chem. Lett. 1978, p. 525–528 (No Month).

Kaloyeros, et al., Tantalum Nitride Films Grown by Inorganic Low Temperature Thermal Chemical Vapor Deposition, J. Electrochem. Soc., 146 (1) 170–176 (1999) (No Month).

Wang, et al., Barrier Properties of Very Thin Ta and TaN Layers Against Copper Diffusion, J. Electrochem. Soc., vol. 145, No. 7, Jul. 1998.

Hieber, K., Structural and Electrical Properties of Ta and Ta Nitrides Deposited by Chemical Vapour Deposition, Thin Solid Films 24 (1974) 157–164 (No Month).

Sugiyama, et al., Low Temperature Deposition of Metal Nitrides by Thermal Decomposition of Organometallic Compounds, J. Electrochem. Soc.: Solid–State Science and Technology, Nov. 1975, 1545–1549.

Chen, et al., Low Temperature Plasma–promoted Chemical Vapor Deposition of Tantalum from Tantalum Pentabromide for Copper Metallization, J. Vac. Sci. Technol. B 16(5), Sep./Oct. 1998, 2887–2890.

Tsai, et al., Comparison of the Diffusion Barrier Properties of Chemical–Vapor–Deposited TaN and Sputtered TaN between Cu and Si, J. Appl. Phys. 79 (9), May 1, 1996, 6932–6938.

Tsai, et al., Metal–Organic Chemical Vapor Deposition of Tantalum Nitride Barrier Layers for ULSI Applications, Thin Solid Films 270 (1995) 531–536 (No Month).

Cho, et al., Chemical Vapor Deposition of Tantalum Nitride Films Using Pentakis(Diethylamido)Tantalum and Ammonia, 1998 Materials Research Society, pp. 531–536 (No Month).

* cited by examiner

SYNTHESIS OF TANTALUM NITRIDE

CROSS-REFERENCE TO RELATED APPLICATIONS

The present application is a continuation-in-part of U.S. patent application Ser. No. 09/256,933 filed Feb. 24, 1999.

STATEMENT REGARDING FEDERALLY SPONSORED RESEARCH OR DEVELOPMENT

Not applicable.

BACKGROUND OF THE INVENTION

Electronic grade tantalum nitride has found increasing interest as barrier layer films in microelectronic devices. As the size of integrated circuit devices become increasingly smaller, chemical vapor deposition (CVD) shows a unique advantage over physical vapor deposition (PVD) for device fabrication in terms of excellent step coverage for trench and stack cell structures.

For the CVD processing of tantalum nitride thin films, various precursors have been studied thus far. A liquid precursor is desirable for the ease and reproducibility of precursor delivery. Tantalum halides (TaX$_5$, X=Br, Cl), A. E. Kaloyeros et al. J. Electrochem. Soc. 1999, 146, p.170–176., K. Hieber, Thin Solid films, 1974, 24, p.157–164., suffer from low volatility and difficulty in delivery due to their solid nature.

Reactions of various tantalum sources containing alkylamide ligands to produce tantalum nitride or carbonitride have been previously disclosed. Fix, et. al., Chemical Vapor Deposition of Vanadium, Niobium and Tantalum Nitride Thin Films, Chem. Mater., Vol. 5, (1993) pp. 614–619, discloses the deposition of non-conductive Ta$_3$N$_5$ films from a solid amide complex Ta(NMe$_2$)$_5$ with ammonia reactant.

Jun et. al., "Low Temperature Deposition of TaCN Films Using Pentakis(diethylamido) tantalum", Jpn. J. Appl. Phys. , Vol. 37, (1998), pp.L30–L32, discloses low temperature deposition (<400° C.) of TaCN from a single source precursor Ta(NEt$_2$)$_5$. Cho, et al., "Chemical Vapor Deposition of Tantalum Nitride Films Using Pentakis(diethylamide) tantalum and Ammonia", Mater. Res. Soc. Symp. Proc. 1998, vol. 514, p.531–536, describes the use of unstable Ta(NEt$_2$)$_5$ with ammonia reactant gas to deposit TaN.

EP 0 869 544 A2 describes the reaction of [(CH$_3$CH$_2$)$_2$N]$_3$Ta=NCH$_2$CH$_3$ with ammonia to form tantalum nitride. Preparation of [(CH$_3$CH$_2$)$_2$N]$_3$Ta=NCH$_2$CH$_3$ requires multi-step synthesis procedures taught by Chiu et al., "Syntheses and Characterization of Organoimido Complexes of Tantalum; Potential Single-Source Precursors to Tantalum Nitride, Polyhedron, Vol. 17, Nos. 13–14, (1998) pp. 2187–2190", or thermal conversion of the related metallacycle compound [(CH$_3$CH$_2$)$_2$N]$_3$Ta[$\eta^2$—CH$_3$CH$_2$N=CH(CH$_3$)] as reported by Takahashi, Y. et al. Chem. Lett. 1978, p.525–528.

Tsai, et. al., "Metalorganic Chemical Vapor Deposition Of Tantalum Nitride By Tertbutylimidotris(Diethylamido) Tantalum For Advanced Metallization", Appl. Phys. Lett. 67, (8) August 1995, pp. 1128–1130 discloses the use of t-BuN=Ta(NEt$_2$)$_3$ in TaN CVD at 600° C. This high temperture process is not compatible with integrated circuit process integration.

Chiu, et. al., "Deposition of Tantalum Nitride Thin Films From Ethylimidotantalum Complex", J. Mat. Sci. Lett, Vol. 11, (1992) pp. 96–98, claimed to have used a liquid mixture of the compounds [(CH$_3$CH$_2$)$_2$N]$_3$Ta=NCH$_2$CH$_3$ and [(CH$_3$CH$_2$)$_2$N]$_3$Ta[$\eta^2$— CH$_3$CH$_2$N=CH(CH$_3$)]. The films deposited at 500–650° C. without any reactant gas contained a significant amount of carbons.

The problems of the prior art have been overcome by the present invention, by providing an appropriate liquid precursor with an attractive vapor pressure for direct liquid injection chemical vapor deposition of tantalum nitride in a thermal process as will be set forth in greater detail below.

BRIEF SUMMARY OF THE INVENTION

The present invention is a method for producing a tantalum nitride layer on a substrate, comprising; directly injecting a liquid mixture of (R$^1$R$^2$N)$_3$Ta(=NR$^3$) and (R$^4$R$^5$N)$_3$Ta[$^2$—R$^6$N=C (R$^7$)(R$^8$)] into a dispersing zone and delivering the dispersed mixture in a reactor containing said substrate at elevated temperature and reacting said mixture with a source of nitrogen selected from the group consisting of ammonia, alkyl amines, N$_2$H$_2$, alkyl hydrazine, N$_2$ and mixtures thereof, to produce said tantalum nitride layer on said substrate, where R$^1$, R$^2$, R$^3$, R$^4$, R$^5$, R$^6$, R$^7$ and R$^8$ are individually C$_{1-6}$ alkyl, aryl or hydrogen., Preferably, the pressure is in the range of 1 mTorr to 760 Torr, more preferably 0.2 Torr to 2.0 Torr.

Preferably, the temperature is in the range of 200° C. to 600° C., more preferably 280° C. to 450° C.

Preferably, the substrate is silicon, silicon oxide, Cu, Al, W, or low-k dielectric materials Preferably, the deposition rate of tantalum nitride is in the range of 200 to 530 Å/minute at 340° C.

Preferably the mixture is [(CH$_3$CH$_2$)$_2$N]$_3$Ta=NCH$_2$CH$_3$ and [(CH$_3$CH$_2$)$_2$N]$_3$Ta[$\eta^2$—CH$_3$CH$_2$N=CH(CH$_3$)].

Preferably, the source of nitrogen is added to the liquid mixture in a gas volumetric ratio of 2:1 to 10:1, more preferably, a gas volumetric ratio of 3:1 to 8:1, most preferably, a gas volumetric ratio of about 4:1 to 6:1.

Alternatively, the present invention is a method for producing a tantalum nitride layer on a substrate, comprising; directly injecting a liquid mixture of (R$^1$R$^2$N)$_3$Ta(=NR$^3$) and (R$^4$R$^5$N)$_3$Ta[$^2$—R$^6$N=C (R$^7$)(R$^8$)] into a nebulizer to form an aerosol of the mixture and delivering the aerosol of the mixture in a reactor containing said substrate at elevated temperature and reacting said mixture with a source of nitrogen selected from the group consisting of ammonia, alkyl amines, N$_2$H$_2$, alkyl hydrazine, N$_2$ and mixtures thereof, to produce said tantalum nitride layer on said substrate, where R$^1$, R$^2$, R$^3$, R$^4$, R$^5$, R$^6$, R$^7$ and R$^8$ are individually C$_{1-6}$ alkyl, aryl or hydrogen.

Further alternatively, the present invention is a method for producing a tantalum nitride layer on a substrate, comprising; directly injecting a liquid mixture of (R$^1$R$^2$N)$_3$Ta(=NR$^3$) and (R$^4$R$^5$N)$_3$Ta[$\eta^2$—R$^6$N=C (R$^7$)(R$^8$)] into a distributor at a first elevated temperature in a reactor containing said substrate at a second elevated temperature and reacting said mixture with a source of nitrogen selected from the group consisting of ammonia, alkyl amines, N$_2$H$_2$, alkyl hydrazine, N$_2$ and mixtures thereof, to produce said tantalum nitride layer on said substrate, where R$^1$, R$^2$, R$^3$, R$^4$, R$^5$, R$^6$, R$^7$ and R$^8$ are individually C$_{1-6}$ alkyl, aryl or hydrogen.

Alternatively, the liquid mixture includes a solvent or solvents.

DETAILED DESCRIPTION OF THE INVENTION

Figure 1:
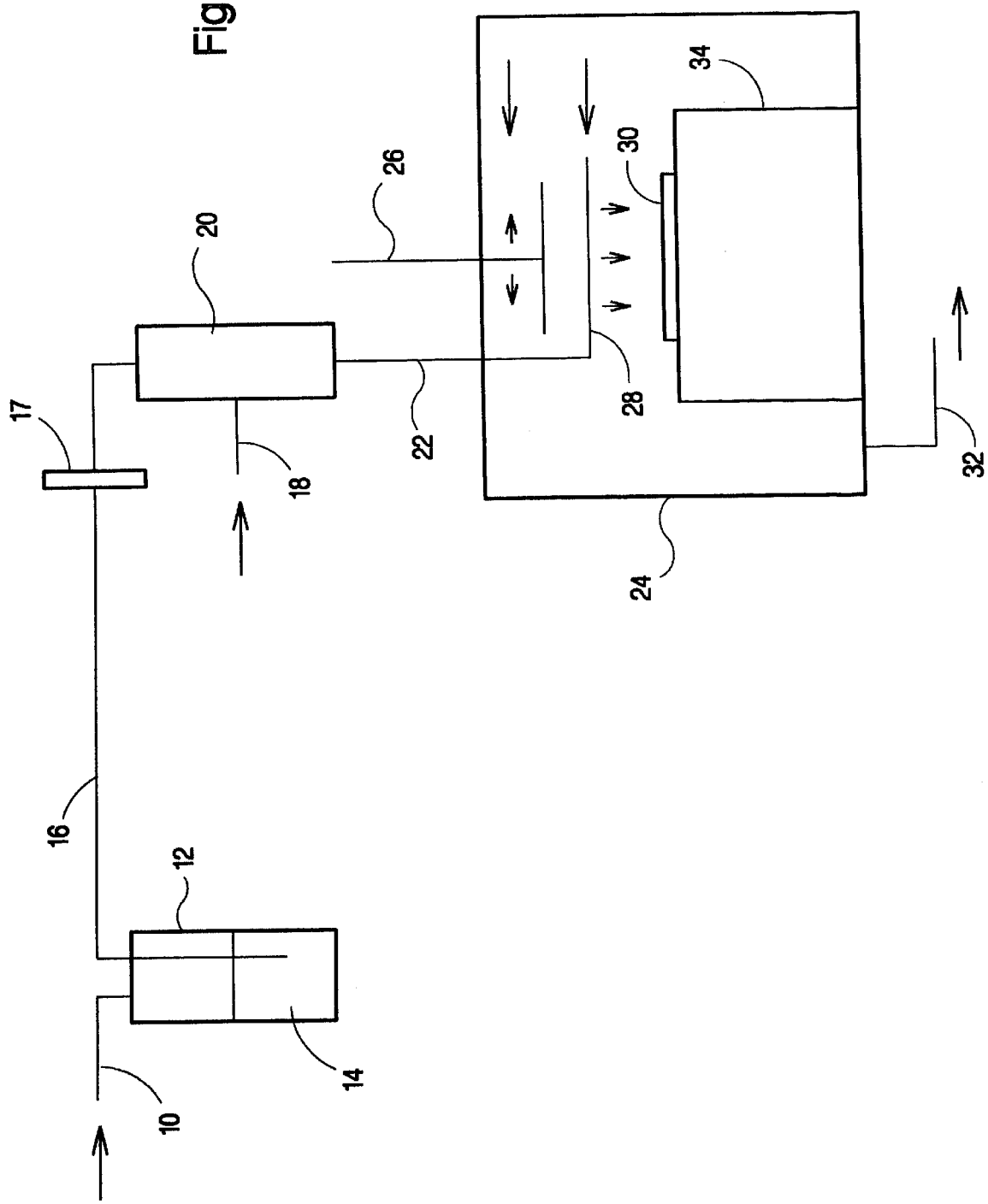
FIG. 1 is a schematic illustration of a preferred embodiment of a system for performing the process of the present invention.

Due to its low resistivity and high electromigration resistance, copper is becoming a substitute for aluminum in multilevel metallization of semiconductor devices. Barrier materials are actively being sought to avoid the diffusion of copper into silicon substrates. Conductive TaN has excellent barrier properties against copper diffusion at high temperatures and is considered one of the most promising candidates. Tantalum nitride has become increasingly important to the microelectronics fabrication industry for copper barrier layer materials of construction.

The present invention uses as the tantalum nitride precursor a combination of, $(R^1R^2N)_3Ta(\!=\!NR^3)$ and $(R^4R^5N)_3Ta[\eta^2\!-\!R^6N\!=\!C\,(R^7)(R^8)]$ in a direct liquid injection in an elevated temperature reactor to produce the tantalum nitride layer on the substrate, where $R^1$, $R^2$, $R^3$, $R^4$, $R^5$, $R^6$, $R^7$ and $R^8$ are individually $C_{1-6}$ alkyl, aryl or hydrogen, but preferably only $R^8$ is hydrogen. Specifically, the present invention uses $[(CH_3CH_2)_2N]_3Ta\!=\!NCH_2CH_3$ and $[(CH_3CH_2)_2N]_3Ta[\eta^2\!-\!CH_3CH_2N\!=\!CH(CH_3)]$ where the latter compound has the structure:

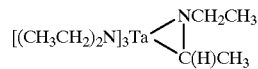

The present invention, in a preferred embodiment, offers a low cost, high performance precursor for tantalum nitride without the need to convert any $[(CH_3CH_2)_2N]_3Ta[\eta^2\!-\!CH_3CH_2N\!=\!CH(CH_3)]$ to $[(CH_3CH_2)_2N]_3Ta\!=\!NCH_2CH_3$, as taught by Takahashi, Y., et. al., below. In addition, these precursors may be conveyed in a solvent. Typical solvents include chemically inert solvents, such as, but not limited to; aliphatic hydrocarbons, aromatic hydrocarbons, alkyl nitrites. Therefore, the liquid mixture can include the precursors dissolved in an appropriate solvent or solvents. Solvent can be used to adjust viscosity or assist in aerosol formation.

The process of making the tantalum nitride layer on a substrate such as silicon, silicon dioxide or metal patterns involves directly injecting the liquid, $(R^1R^2N)_3Ta(\!=\!NR^3)$ and $(R^4R^5N)_3Ta[\eta^2\!-\!R^6N\!=\!C\,(R^7)(R^8)]$ into an appropriate dispersing zone, which could comprise a flash elevated temperature vaporizer, a heated distributor actually in the reactor furnace or an aerosol generator in which the aerosol can then be heated to a vapor and delivering the vapor in an appropriate reactor for chemical vapor deposition, such as a cold wall reactor, and reacting the precursor with a source of nitrogen selected from the group consisting of ammonia, alkyl amines, $N_2H_2$, alkyl hydrazine, $N_2$ and mixtures thereof, at temperatures in the range of 200° C. to 600° C, preferably 280° C. to 450° C. and a pressure of 1 m Torr to 760 Torr, preferably 0.2 to 2.0 Torr and reactant flow rates of 1 standard cubic centimeters per minute (sccm) to 100 sccm. The ratio of $(R^1R^2N)_3Ta(\!=\!NR^3)$ to $(R^4R^5N)_3Ta[\eta^2\!-\!R^6N\!=\!C\,(R^7)(R^8)]$ is in the range of greater than 99:1 to 1:99, preferably 6:4 to 9:1, and the volume ratio of nitrogen source gas to precursor vapor mixture is preferably 2:1 to 10:1, more preferably 3:1 to 8:1, and most preferably 4:1 to 6:1.

Direct liquid injection ("DLI") differs from vapor delivery from bubblers as is standard in the industry for these type of depositions. Direct liquid injection is performed by directly transporting a liquid precursor at a precisely controlled rate into a vaporizer where it is evaporated by thermal flash vaporization and the resultant vapor is delivered into a CVD reactor chamber through a shower head, or an injector, or alternately, the liquid is injected directly into the reactor into a heated distributor and vaporizes in the reactor itself. Further alternatively, the liquid is subjected to aerosol generation through an appropriate nozzle or vibration induced aerosol generation by electric frequencies, ultrasonics or piezoelectric action. This aerosol is then vaporized by elevated temperature prior to introduction into the reactor where deposition occurs. This process, in its various described embodiments, is preferred since it enables vaporization of a mixture of liquid precursors or a blend of precursor solutions and thereby provides a precisely controlled mixture of vapors into a CVD reactor at a constant rate. DLI delivers the same ratio of constituents to the reactor as are in the source container. Another advantage of this approach versus conventional delivery using a bubbler system is that in DLI the bulk of the precursor(s) is stored in a container under ambient temperature and pressure, therefore, the thermal exposure of precursor is minimized, providing improved shelf life. Thus, it is particularly suitable for delivery of temperature sensitive precursors. DLI provides higher deposition rate compared to that of CVD using delivery by bubbling.

The direct liquid injection by flash vaporization is shown as a preferred embodiment with reference to FIG. 1. An inert push gas 10, such as helium, is introduced into the headspace above the liquid mixture 14 of $[(CH_3CH_2)_2N]_3Ta\!=\!NCH_2CH_3$ and $[(CH_3CH_2)_2N]_3Ta[\eta^2\!-\!CH_3CH_2N\!=\!CH(CH_3)]$ in ampoule 12. This forces the liquid mixture 14 out through liquid flow line 16 trough flow controller 17 to a dispersing zone 20, which preferably is a flash vaporizer operated at about 90° C. The liquid mixture 14 is comingled with an inert carrier gas 18, such as helium and vaporized. The vaporized mixture and carrier gas are introduced through line 22 into the reactor furnace 24 with the assistance of distributor 28, such as a ring injector or porous metal diffuser. The nitrogen source, such as ammonia, is introduced into the reactor furnace 24 through injector 26. The layer or film of cubic TaN is deposited on the target 30, such as a silicon wafer. The wafer is mounted on an acceptable mount 34 or wafer chuck. The reactor furnace 24 and the dispersing zone 20 are the subject of vacuum from a source of vacuum 32. As described above, the external vaporizer could be eliminated and vaporization performed directly in the reactor furnace in a heated distributor.

Figure 2:
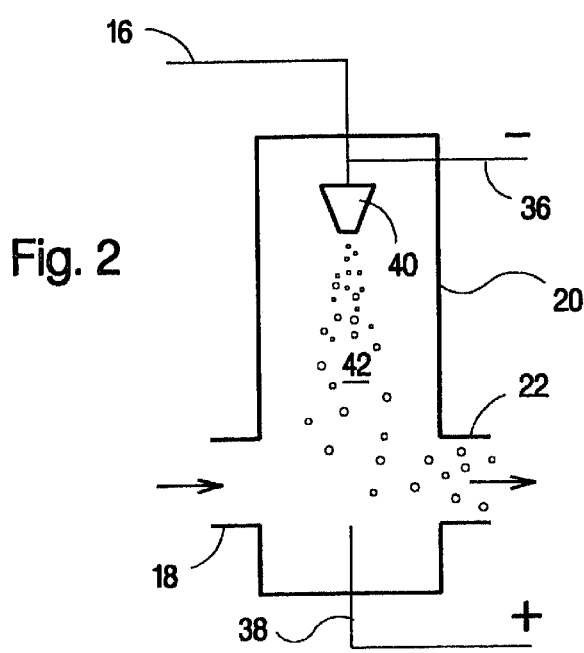
FIG. 2 is a schematic illustration of an alternative embodiment of a system for performing the process of the present invention.

Alternatively, the dispersing zone, rather than being a flash vaporizer as depicted in FIG. 1, could be an aerosol generator, as depicted in FIG. 2. In FIG. 2, the nebulizer 20 comprises the liquid flow line 16 delivering liquid mixture to the nebulizer or aerosol generator 20. The liquid mixture exits a nozzle 40 as aerosol droplets by the action of electrical frequency induced vibrations, sonication, or piezoelectric effect. The droplets 42 migrate from the negative anode 36 toward the positive cathode 38, but before the droplets contact the cathode 38, they are caught in the flowing stream of an inert gas in line 18 and are preferably thermally vaporized and directed to the reactor furnace through line 22. All of the other features of this direct liquid injection process are the same as depicted in FIG. 1.

Typically, $[(CH_3CH_2)_2N]_3Ta\!=\!NCH_2CH_3$ and $[(CH_3CH_2)_2N]_3Ta[^2\!-\!CH_3CH_2N\!=\!CH(CH_3)]$ can be easily synthesized (TaCl$_5$+5LiNEt$_2$) with an isolated yield of over 60% according to the literature method: Bradley, et al. *Can. J. Chem.* 1962, 40, p.1355–1360; Takahashi, Y. et al. *Chem. Lett.* 1978, p.525–528.

In the present invention, a known liquid complex, [(CH$_3$CH$_2$)$_2$N]$_3$Ta=NCH$_2$CH$_3$ and [(CH$_3$CH$_2$)$_2$N]$_3$Ta[η$^2$—CH$_3$CH$_2$N=CH(CH$_3$)] was found to be a promising candidate as a precursor for the CVD of pure tantalum nitride by direct liquid injection using ammonia as a reactant gas, as will be set forth in the examples below. [(CH$_3$CH$_2$)$_2$N]$_3$Ta=NCH$_2$CH$_3$ and [(CH$_3$CH$_2$)$_2$N]$_3$Ta[η$^2$—CH$_3$CH$_2$N=CH(CH$_3$)] provide sufficient volatility and thermal stability for direct liquid injection CVD applications. The following examples support the present invention.

EXAMPLE 1

CVD of Tantalum Nitride using a Bubbler System for Precursor Delivery

Tantalum nitride was deposited on a 4-inch diam. Silicon wafer using a warm-wall low pressure CVD (LPCVD) system at a chamber pressure of 1.5 Torr using [(CH$_3$CH$_2$)$_2$N]$_3$Ta=NCH$_2$CH$_3$ and [(CH$_3$CH$_2$)$_2$N]$_3$Ta[η$^2$—CH$_3$CH$_2$N=CH(CH$_3$)] (7:3 molar ratio). The precursor container and delivery lines were heated to 85° C. to 99° C., respectively. A Si(100) substrate was heated to 384° C. 30 standard cubic centimeters/minute (sccm) of ammonia gas was introduced into the chamber. The precursor was delivered to the chamber with a nitrogen carrier gas flow of 150 sccm. After 10 min of deposition, a non-reflective gray thin film of thickness 1500 Å was obtained (deposition rate: approximately 150 Å/min at 384° C.), which was non-uniform even by visual inspection (various areas had powdered surface appearance, reflective surface appearance or dull surface appearance). XRD analysis showed that as-deposited films were cubic TaN with marginal crystallinity. Annealing at 500° C. under nitrogen for 30 min. enhanced the crystallinity. The energy dispersive X-ray (EDX) analysis showed that the deposited film consist of tantalum and nitrogen with no detectable impurities, such as carbon and oxygen. Auger electron spectroscopy (AES) revealed that as deposited bulk film contained N/Ta=1.3, and the impurity levels of carbon: 7 atomic % and oxygen: 5 atomic %.

EXAMPLE 2

CVD of Tantalum Nitride using Direct Liquid Injection

Tantalum nitride was deposited on 4-inch diam. Silicon wafers using a warm-wall LPCVD reactor equipped with a direct liquid injection system (liquid flow controller/vaporizer/injector) at a chamber pressure of 1.0 Torr using a mixture of [(CH$_3$CH$_2$)$_2$N]$_3$Ta=NCH$_2$CH$_3$ and [(CH$_3$CH$_2$)$_2$N]$_3$Ta[η$^2$—CH$_3$CH$_2$N=CH(CH$_3$)] (7:3 molar ratio). The precursor was delivered into the vaporizer at 25° C. at a flow rate of 0.08 mL/min. and vaporized at 90° C. The precursor vapor was delivered to the chamber with a helium sweep gas flow of 100 sccm. A flow of NH$_3$ gas was introduced into the chamber at a rate of NH$_3$: precursor volume ratio=2:1 to 10:1. Si(100) substrates were heated to 340° C. After 2–20 min of deposition, conductive thin films with high uniformity (standard deviation less than 0.5% based on 9 points measurement by spectral reflectance) were obtained. The refractive index of the films, measured by ellipsometry, were 2.5–2.6. EDX demonstrated that films consist of Ta and N, while no C was detected. Deposition rates ranged from 200 to 530 Å/min. at 340° C. depending on the partial pressure of NH$_3$ gas.

The comparative examples of the bubbler sourced vapor delivery of Example 1 and the direct liquid injection of Example 2 of the present invention demonstrate that the present invention enjoys considerable advantages. The direct liquid injection of the present invention's Example 2 (200 to 530 Å/min.) had significantly higher deposition rates than the bubbler sourced vapor delivery of Example 1 (150 Å/min.). These greater deposition rates occurred at a lower deposition temperature (340° C. for Example 2 versus 384° C. for Example 1).

Figure 3:
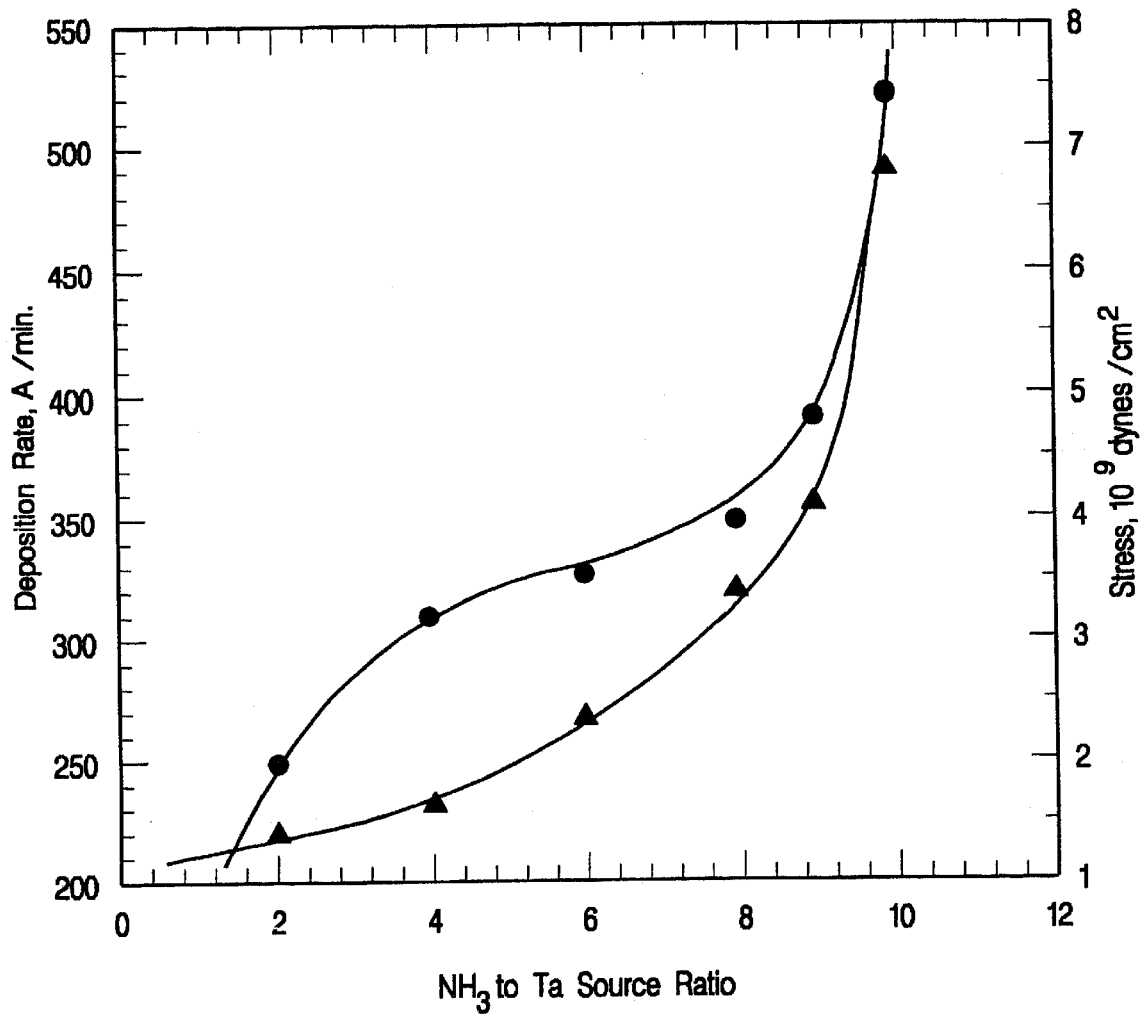
FIG. 3 is a graph of deposition rate and film stress against increasing ammonia addition to the precursor.

FIG. 3 demonstrates an unexpected benefit of a range of gas volumetric ratio of nitrogen source reactant to liquid mixture using (R$^1$R$^2$N)$_3$Ta(=NR$^3$) and (R$^4$R$^5$N)$_3$Ta[η$^2$—R$^6$N=C (R$^7$)(R$^8$)]. Deposition rate increases dramatically as the nitrogen source reactant (NH$_3$) is increased reaching a plateau prior to the detrimental rapid increase in mechanical stress of the resulting TaN film. It is unexpected and unpredictable that deposition rate would reach an initial plateau at conditions short of the onslaught of significantly increased mechanical stress of the resulting films. Therefore, although the present invention encompasses the reactant ratios of preferably 2:1 to 10:1 for nitrogen source gas to precursor vapor of the liquid mixture, an unexpectedly preferred range is demonstrated in FIG. 3 at 3:1 to 8:1 and most preferred at about 4:1 to 6:1. Too high of a volumetric ratio of nitrogen source obviously stresses the TaN film unfavorably despite rapid deposition.

The process of the present invention using (R$^1$R$^2$N)$_3$Ta(=NR$^3$) and (R$^4$R$^5$N)$_3$Ta[η$^2$—R$^6$N=C (R$^7$)(R$^8$)] in combination without the added step of purifying the former compound from the latter compound or without converting the latter compound to the former compound, provides a simple, inexpensive process for preparing high purity tantalum nitride barrier layer for copper in a form where the precursor is easily delivered to the reaction site or the substrate to be treated due to the high vapor pressure property of the liquid precursor, particularly for direct liquid injection. The state of low viscous liquid phase of the precursor enables a use of a direct liquid injection method, which provides precise and reproducible control of precursor delivery and higher deposition rates than other CVD processes using a bubbler for precursor delivery. In addition, the present combination precursor results in tantalum nitride films with minimal carbon incorporation and other defects and provides good conformal coverage of various nonplanar surfaces as are found in multilayer electronic device structures presently fabricated and envisioned by the electronics industry.

In the present invention, (R$^1$R$^2$N)$_3$Ta(=NR$^3$) and (R$^4$R$^5$N)$_3$Ta[η$^2$—R$^6$N=C (R$^7$)(R$^8$)] is used in combination with an ammonia reactant gas for low temperature deposition of tantalum nitride at below 400° C. The precursor mixture is easily synthesized without the necessity for isolating the major reaction product from the minor reaction product. Many problems of the prior art have been overcome by the present invention since the precursor is a thermally stable liquid with low viscosity and sufficient volatility, easily synthesized in one step, and when delivered by direct liquid injection (DLI) and used with ammonia, it provides CVD TaN films at temperatures as low as 340° C. DLI is a preferred method in the industries due to: a) an ease of precursor delivery into a vaporizer at room temperature; b) capability of providing fine control and reproducible delivery of precursor; and c) a higher deposition rate than conventional bubbler type delivery.

The use of direct liquid injection for the delivery process of the present invention avoids the necessity of vapor delivery of heat tracing the delivery lines, and avoids the possibility of differential vaporization of one component over the other component in a multiple component liquid precursor, as in the present invention.

The present invention has been set forth with regard to several preferred embodiments, but the full scope of the present invention should be ascertained from the claims which follow.

What is claimed is:

1. A method for producing a tantalum nitride layer on a substrate, comprising; directly injecting by liquid flow controller/vaporizer/injector a liquid mixture of $(R^1R^2N)_3Ta(=NR^3)$ and $(R^4R^5N)_3Ta(\eta^2-R^6N=C(R^7)(R^8))$ into a dispersing zone and delivering a resulting dispersed mixture in a reactor containing said substrate at elevated temperature and reacting said mixture with a source of nitrogen added to said mixture in a volumetric ratio of 3:1 to 8:1 of ammonia, to produce said tantalum nitride layer on said substrate, where $R^1$, $R^2$, $R^3$, $R^4$, $R^5$, $R^6$, $R^7$ and $R^8$ are individually aryl, $C_{1-6}$ alkyl, or hydrogen.

2. The method of claim 1 including a pressure during said reacting in the range of 1 mTorr to 760 Torr.

3. The method of claim 1 wherein the temperature is in the range of 200° C. to 600° C.

4. The method of claim 1 wherein said substrate is silicon, silicon oxide, Cu, Al, W, or low-k dielectric materials.

5. The method of claim 1 wherein the deposition rate of tantalum nitride is in the range of 200 to 530 angstroms/minute at 340° C. at said substrate.

6. The method of claim 1 wherein said $(R^1R^2N)_3Ta(=NR^3)$ and $(R^4R^5N)_3Ta[\eta^2—R^6N=C(R^7)(R^8)]$ are $[(CH_3CH_2)_2N]_3Ta=NCH_2CH_3$ and $[(CH_3CH_2)_2N]_3Ta[\eta^2—_3CH_2N=CH(CH_3)]$, respectively.

7. The method of claim 1 wherein said source of nitrogen is added to said mixture in a gas volumetric ratio of about 4:1 to 6:1.

8. The method of claim 1 wherein said liquid mixture includes a solvent.

* * * * *